US008896183B2

(12) United States Patent
Matsuo

(10) Patent No.: US 8,896,183 B2
(45) Date of Patent: Nov. 25, 2014

(54) ULTRASONIC VIBRATION DEVICE

(75) Inventor: Kenji Matsuo, Nagaokakyo (JP)

(73) Assignee: Murata Manufacturing Co., Ltd., Nagaokakyo-Shi (JP)

( * ) Notice: Subject to any disclaimer, the term of this patent is extended or adjusted under 35 U.S.C. 154(b) by 189 days.

(21) Appl. No.: 13/556,489

(22) Filed: Jul. 24, 2012

(65) Prior Publication Data

US 2012/0286626 A1 Nov. 15, 2012

Related U.S. Application Data

(63) Continuation of application No. PCT/JP2011/051278, filed on Jan. 25, 2011.

(30) Foreign Application Priority Data

Jan. 25, 2010 (JP) ................................ 2010-012691
Sep. 24, 2010 (JP) ................................ 2010-213163

(51) Int. Cl.
*H01L 41/053* (2006.01)
*G10K 9/122* (2006.01)
*G10K 9/22* (2006.01)
*B06B 1/06* (2006.01)

(52) U.S. Cl.
CPC *G10K 9/122* (2013.01); *G10K 9/22* (2013.01); *B06B 1/0685* (2013.01)
USPC ....... 310/322; 310/323.16; 310/324; 310/334

(58) Field of Classification Search
CPC ...... B06B 1/0622; G10K 11/02; H04R 17/00; H02N 2/026; H02N 2/103
USPC .................................... 310/323.16, 324, 334
See application file for complete search history.

(56) References Cited

U.S. PATENT DOCUMENTS 4,556,814 A 12/1985 Ito et al.
6,773,401 B1 * 8/2004 Dreschel et al. ............. 600/459

(Continued)

FOREIGN PATENT DOCUMENTS

CN 101258772 A 9/2008
JP 58-155200 10/1983

(Continued)

OTHER PUBLICATIONS

Supplementary European Search Report issued for corresponding application EP 11 73 4807, dated Nov. 27, 2013.

(Continued)

*Primary Examiner* — Thomas Dougherty
*Assistant Examiner* — Bryan Gordon
(74) *Attorney, Agent, or Firm* — Dickstein Shapiro LLP

(57) ABSTRACT

In an inner bottom surface of a case, a substantially oblong recess having a long axis and a short axis forms a vibration area. A piezoelectric element is bonded to the center of the recess. On the opposite sides of the vibration area, vibration suppression areas thicker than the vibration area are disposed. A side portion of the case is formed to be thin over the entire circumference thereof. A reinforcing member higher in rigidity than the case is bonded to upper portions of the vibration suppression areas. The reinforcing member has a bottom surface substantially equal to the shape of the vibration suppression areas, and has a predetermined height. A gap between the reinforcing member and an inner side surface of the case is also filled with a filling member.

17 Claims, 8 Drawing Sheets

(56) References Cited

U.S. PATENT DOCUMENTS

| | | | | |
|---|---|---|---|---|
| 7,728,486 | B2 * | 6/2010 | Matsuo | 310/322 |
| 7,956,516 | B2 * | 6/2011 | Hayashi et al. | 310/334 |
| 2008/0218030 | A1 * | 9/2008 | Asada et al. | 310/334 |
| 2009/0218913 | A1 * | 9/2009 | Hirano et al. | 310/326 |
| 2009/0302712 | A1 * | 12/2009 | Ota | 310/334 |

FOREIGN PATENT DOCUMENTS

| | | | |
|---|---|---|---|
| JP | 60-139339 | | 9/1985 |
| JP | 4-116498 | | 10/1992 |
| JP | 09-284896 | A | 10/1997 |
| JP | 2000-188800 | A | 7/2000 |
| JP | 2002-209294 | | 7/2002 |
| JP | 2002-238095 | | 8/2002 |
| JP | 2005-341166 | | 12/2005 |
| JP | 2000-023296 | | 1/2006 |
| JP | 2007-318742 | | 12/2007 |
| JP | 2008-005334 | A | 1/2008 |
| JP | 2008-311736 | A | 12/2008 |
| WO | WO-2007/029559 | | 3/2007 |
| WO | WO-2007/069609 | A1 | 6/2007 |

OTHER PUBLICATIONS

PCT/JP2011/051278 Written Opinion dated Jul. 3, 2011.

* cited by examiner

ULTRASONIC VIBRATION DEVICE

CROSS REFERENCE TO RELATED APPLICATIONS

The present application is a continuation of International application No. PCT/JP2011/051278, filed Jan. 25, 2011, which claims priority to Japanese Patent Application No. 2010-012691, filed Jan. 25, 2010, and Japanese Patent Application No. 2010-213163, filed Sep. 24, 2010, the entire contents of each of which are incorporated herein by reference.

FIELD OF THE INVENTION

The present invention relates to an ultrasonic vibration device used in an ultrasonic sensor or the like which detects an object by transmitting and receiving ultrasonic waves.

BACKGROUND OF THE INVENTION

An ultrasonic sensor which measures the distance to a target object by using ultrasonic waves is requested to have sharp directivity. To improve the directivity of the ultrasonic sensor, the vibration mode of a vibration surface has been devised in the past.

For example, ultrasonic vibration devices each serving as an on-vehicle ultrasonic sensor for a back sonar are disclosed in Patent Documents 1 and 2. In both of the ultrasonic vibration devices of Patent Documents 1 and 2, a piezoelectric element is bonded to a cylindrical case with a bottom, and the interior of the case is provided with a sound-absorbing member for absorbing rear sound and is filled with an elastic damping member to attenuate vibration.

The ultrasonic vibration device of Patent Document 1 is configured to use a case hollowed out into an elliptical shape having a long axis and a short axis, and obtain the anisotropy of radiating acoustic waves in accordance with vibration with nodes occurring in a bottom portion of the case.

FIG. 1 is a cross-sectional view of the ultrasonic vibration device disclosed in Patent Document 2. An ultrasonic vibration device 10 includes a cylindrical cap body 12 with a bottom. A piezoelectric element 14 is bonded to a bottom surface portion 12*a* inside the cap body 12 by a conductive adhesive agent or the like. An inner frame 16 higher in acoustic impedance than the cap body 12 is fit inside the cap body 12. The inner frame 16 is fit to be in close contact with a side surface portion 12*b* including an end portion of the cap body 12. A side surface of the inner frame 16 is formed with through-holes 22. Wiring members 24*a* and 24*b* are connected to the piezoelectric element 14 and the inner frame 16, respectively. The interior of the inner frame 16 is filled with a sound-absorbing member 26 and a damping member 28. The damping member 28 is in direct contact with the side surface portion 12*a* of the cap body 12 through the through-holes 22 of the inner frame 16.

Patent Document 1: Japanese Unexamined Patent Application Publication No. 9-284896

Patent Document 2: Pamphlet of International Publication No. WO 2007/069609

SUMMARY OF THE INVENTION

In the configuration of Patent Document 1, a side portion of the case is thick on the short-axis sides and thin on the long-axis sides of the substantially elliptical shape. Therefore, vibration generated by bending vibration of the piezoelectric element is propagated from the bottom surface of the case to the thin sides of a side wall portion of the case. This propagated vibration is damped by the elastic damping member or the like, and thereby the reverberation time is reduced. To obtain characteristics required for practical use by using this structure, however, it is required to damp the vibration per se occurring in the bottom surface of the case, i.e., an acoustic wave radiating surface.

If a member for damping the vibration (a filling member or the like, for example) is provided near the bottom surface of the case, however, the reverberation is reduced, but at the same time there arises an issue of degradation in sensitivity. That is, the sensitivity and the reverberation have a trade-off relationship.

In the configuration of Patent Document 2, the inner frame is formed in an opening portion, and thus the leakage of vibration from the bottom surface of the cap body to a side wall portion of the cap body is suppressed. However, it has been found difficult to sufficiently suppress the reverberation to obtain characteristics required for practical use, even if the damping member is brought into direct contact with the side surface portion of the cap body through the through-holes of the inner frame. Further, it is difficult, in terms of manufacturing method, to partially provide the inner frame with through-holes and completely cover the through-holes with a filling member.

In view of the above, an object of the present invention is to provide an ultrasonic vibration device intended to achieve high sensitivity, low reverberation, and low cost.

An ultrasonic vibration device according to the present invention includes a cylindrical case with a bottom and a piezoelectric element bonded to an inner bottom surface of the case. An inner bottom portion of the case is provided with a vibration area including a bonding position of the piezoelectric element and a vibration suppression area disposed outside the vibration area and thicker than the vibration area. A reinforcing member higher in rigidity than the inner bottom portion of the case is disposed on the vibration suppression area. A side portion of the case is uniform in thickness, and the interior of the case is filled with an elastic resin.

It is preferred that the elastic resin reaches a peripheral portion of the inner bottom portion.

It is preferred that the elastic resin reaches a gap between the side portion of the case and the reinforcing member.

It is preferred that the vibration suppression area is divided by the vibration area, and that the reinforcing member is formed to extend across the divided vibration suppression area.

It is preferred to design the configuration such that, when the height of the case, the thickness of the vibration suppression area, and the thickness of the reinforcing member are represented by t0, t1, and t2, respectively, a relationship $0.67 \leq t2/t1 \leq 1.5$, $0.11 \leq t1/t0 \leq 0.25$, and $t1+t2<t0$ is established.

According to the present invention, the vibration suppression area and the reinforcing member reinforcing this are provided near the bottom surface of the case. Therefore, a portion of the bottom surface of the case corresponding to the vibration suppression area and the side portion of the case are increased in rigidity, and it is possible to more suppress the propagation of the vibration of the bottom surface of the case to the side portion of the case, and to form a vibration surface which transmits and receives necessary ultrasonic waves.

Further, with the above-described configuration, the entire circumference of the side portion of the case is reduced in thickness to reduce the rigidity thereof, and the interior of the case is filled with the filling member. Thereby, it is possible to increase the area of direct contact between the filling member and the case, and the vibration of the side portion of the case is more subject to damping. Therefore, the damping of the bottom portion of the case is not required, unlike the related art structure. Accordingly, it is possible to obtain reverberation performance without degrading acoustic performance, as compared with the related art.

Further, it is possible to reduce the difference in thickness of the entire case. Accordingly, it is possible to select a highly productive manufacturing method, such as forging, and to reduce the processing cost.

DESCRIPTION OF THE PREFERRED EMBODIMENTS

First Embodiment

Figure 1:
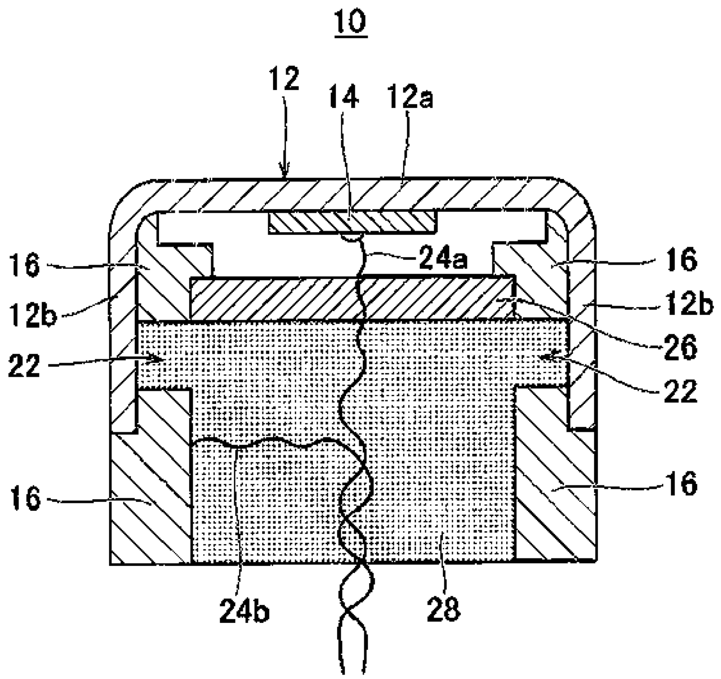
FIG. 1 PRIOR ART
FIG. 1 is a cross-sectional view of an ultrasonic vibration device disclosed in Patent Document 2.
Figure 2A:
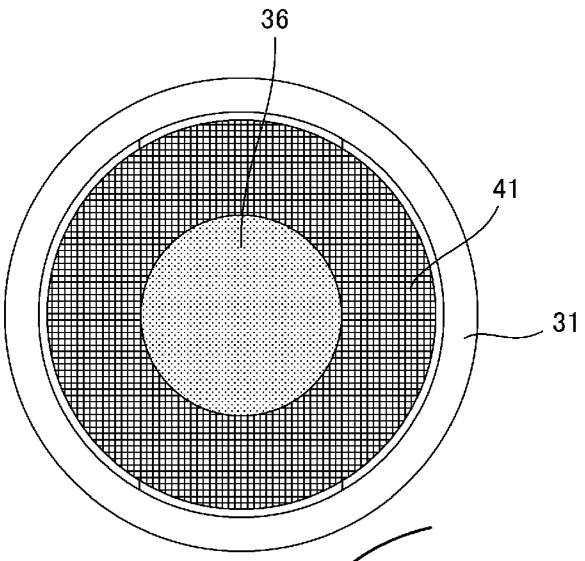
FIG. 2(A) is a plan view of an ultrasonic vibration device 101 according to a first embodiment before being filled with a filling member 35, as viewed from the side of an opening surface of a case 31.
Figure 2B:
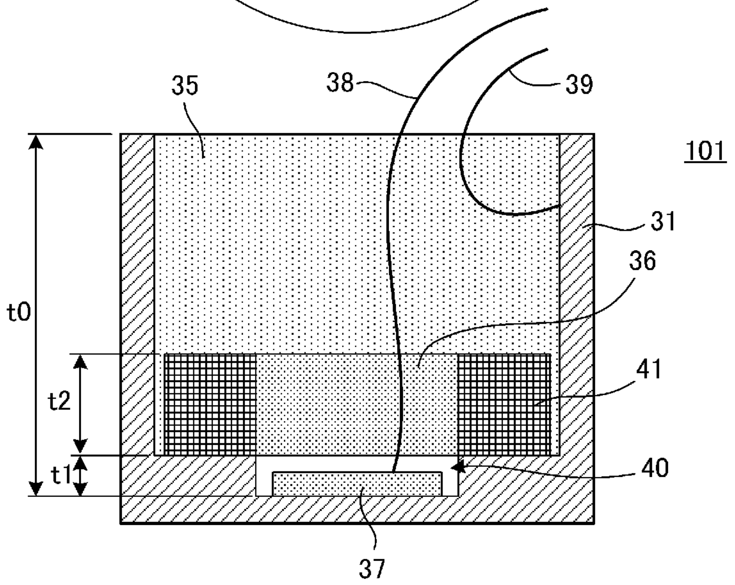
FIG. 2(B) is a cross-sectional view of the ultrasonic vibration device 101.

FIG. 2(A) is a plan view of an ultrasonic vibration device 101 according to a first embodiment before being filled with a filling member 35, as viewed from the side of an opening surface of a case 31. FIG. 2(B) is a cross-sectional view of the ultrasonic vibration device 101, and FIG. 2(C) is a plan view of the case 31 as viewed from the side of the opening surface thereof.

Figure 2C:
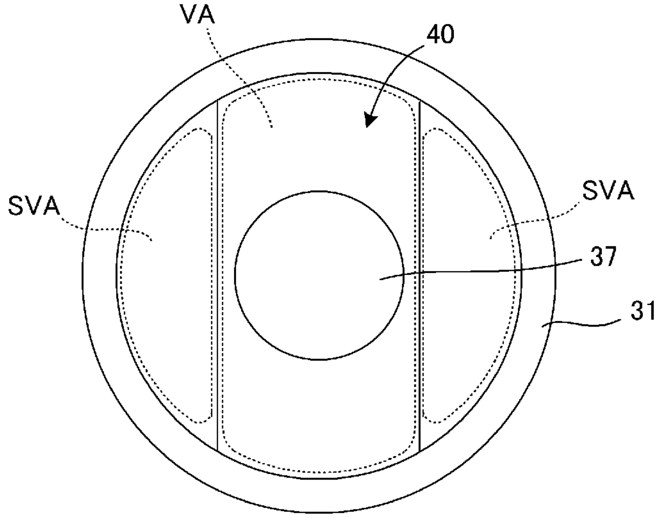
FIG. 2(C) is a plan view of the case 31 as viewed from the side of the opening surface thereof.

As illustrated in FIG. 2(B) and FIG. 2(C), the case 31 is a cylindrical case with a bottom. An inner bottom surface of the case 31 is formed with a substantially oblong recess 40 having a long axis and a short axis. A piezoelectric element 37 is bonded to the center of this recess 40 (also the center of the inner bottom surface of the case 31). The substantially oblong recess 40 in the inner bottom surface of the case 31 mainly forms a vibration area VA. Further, vibration suppression areas SVA thicker than the vibration area are disposed on the opposite sides of the vibration area VA in the inner bottom surface of the case 31. A side portion of the case 31 is thin, and the thickness thereof is uniform. Herein, being uniform in thickness does not indicate complete uniformity, and it suffices if the thickness is substantially uniform. In this case 31, the difference in thickness of the entire case (particularly the difference in thickness of the side portion) is small. It is therefore possible to select a highly productive manufacturing method, such as forging, and to reduce the processing cost.

As illustrated in FIG. 2(A) and FIG. 2(B), a ring-shaped reinforcing member 41 is bonded by adhesion or the like onto upper portions of the vibration suppression areas SVA. The reinforcing member 41 has a bottom surface substantially equal to the width of the vibration suppression areas SVA, and has a predetermined height. The reinforcing member 41 is made of a material higher in rigidity than that of the case 31. The case 31 is made of aluminum, for example, and the reinforcing member 41 is made of zinc, brass, stainless steel, or the like.

As illustrated in FIG. 2(B), a sound-absorbing member 36 is disposed at a position facing the vibration area VA, with a certain gap formed between the sound-absorbing member 36 and the piezoelectric element 37. As this sound-absorbing member 36, sponge, felt, elastic foam, or the like may be used. The interior of the case 31 is filled with a filling member 35 made of an elastic resin material, such as a silicone resin and a urethane resin, for example. The reinforcing member 41 is not bonded to the inner side surface of the case 31, and there is a gap therebetween. Thus, the gap is also filled with the filling member 35. Therefore, the filling member fills to a peripheral portion of an inner bottom portion of the case 31 (a side portion of the case near the inner bottom portion), and the entire circumference of the side portion of the case 31 is damped by the filling member 35.

An electrode (not illustrated) formed on one surface of the piezoelectric element 37 is in electrical continuity with the inner bottom surface of the case 31. A wiring member 38 is connected to an electrode (not illustrated) formed on the other surface of the piezoelectric element 37. Further, a wiring member 39 is connected to the case 31. These wiring members 38 and 39 are drawn outside through the portion filled with the filling member 35.

The vibration suppression areas SVA and the reinforcing member 41 reinforcing these are thus formed on the inner bottom surface of the case 31. Thereby, the vibration suppression areas SVA have high rigidity, and it is possible to more suppress the propagation of the vibration of the bottom surface of the case 31 to the side portion of the case 31, and to form a vibration surface which transmits and receives necessary ultrasonic waves. Further, the side portion of the case 31 is reduced in thickness over the entire circumference to reduce the rigidity thereof, and the area of direct contact between the filling member 35 and the case 31 is increased. Thereby, a high damping effect due to the filling member 35 is obtained.

It has been found possible to effectively damp the vibration propagated to the side portion of the case 31 by preventing, as much as possible, the propagation of the vibration generated in the bottom portion of the case 31 to the side portion of the case 13 with increased rigidity of the bottom surface of the case 31, reducing, as much as possible, the thickness of the side portion of the case 31 extending from the bottom portion of the case 31 toward the opening of the case 31, and increasing, as much as possible, the area of contact between the side portion of the case 31 and the filling member 35 filling the interior of the case 31.

Figure 3A:
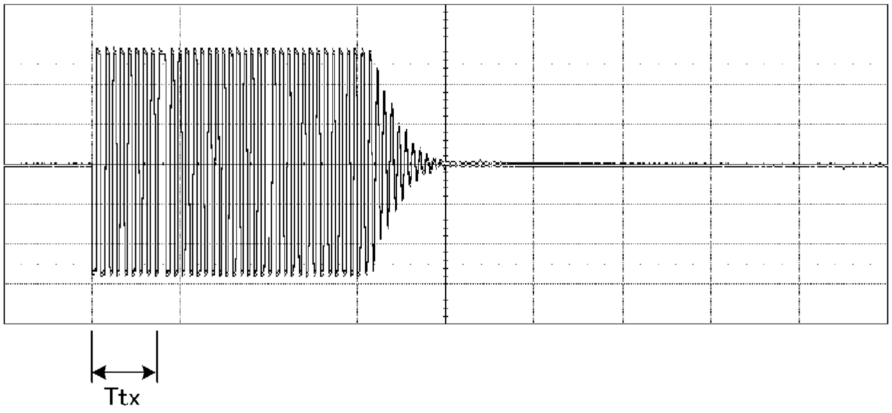
FIG. 3(A) is a waveform diagram illustrating a reverberation characteristic of the ultrasonic vibration device 101 according to the first embodiment.
Figure 3B:
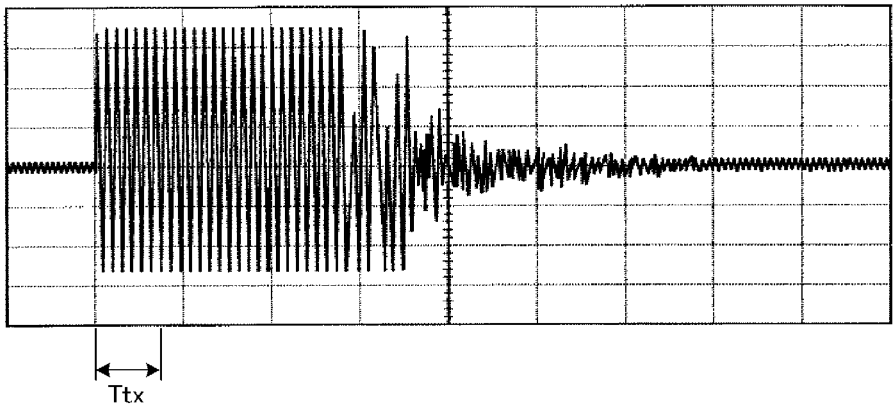
FIG. 3(B) is a waveform diagram illustrating a reverberation characteristic of an ultrasonic vibration device having a structure disclosed in Patent Document 1.

FIG. 3(A) is a waveform diagram illustrating a reverberation characteristic of the ultrasonic vibration device 101 according to the first embodiment, and FIG. 3(B) is a waveform diagram illustrating a reverberation characteristic of an ultrasonic vibration device having a structure disclosed in Patent Document 1. In both diagrams, the horizontal axis is represented on a scale of 200 μs/div, and the vertical axis is represented on a scale of 5 V/div. Further, both diagrams illustrate the result of observation of a voltage waveform appearing in the piezoelectric element 37 as a result of transmission of eight burst waves in a transmission time Ttx. In fact, the attenuation of the amplitude starts immediately after the completion of the transmission. However, the amplitude exceeds the dynamic range of an amplifier circuit for a while. Thus, the waveform is saturated during that time.

Further, as to the ultrasonic vibration device 101 according to the first embodiment, when the height dimension of the case 31, the thickness of the vibration suppression areas SVA, and the thickness dimension of the reinforcing member 41 are represented as t0, t1, and t2, respectively, the dimensions of the respective portions are as follows.

t0=9 mm t1=1.5 mm t2=1.5 mm t2/t1=1 t1/t0=0.17

As is obvious from comparison between FIG. 3(A) and FIG. 3(B), in the ultrasonic vibration device 101 according to the first embodiment, the amplitude is clearly attenuated, and the reverberation is low.

Figure 4A:
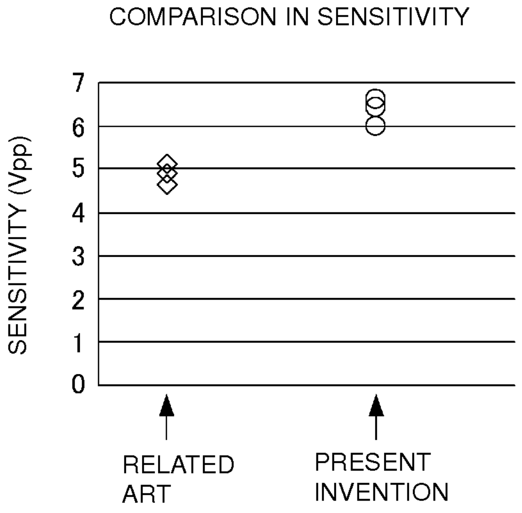
FIG. 4(A) is a diagram illustrating sensitivities of the ultrasonic vibration device 101 according to the first embodiment and the ultrasonic vibration device disclosed in Patent Document 1.
Figure 4B:
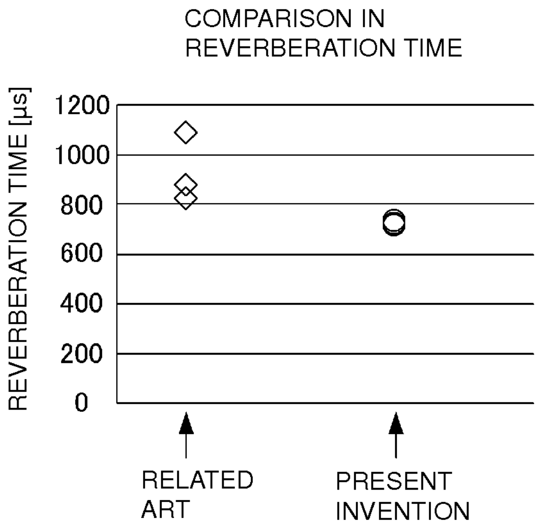
FIG. 4(B) is a diagram illustrating reverberation times of the ultrasonic vibration device 101 according to the first embodiment and the ultrasonic vibration device disclosed in Patent Document 1.

FIG. 4(A) is a diagram illustrating sensitivities of the ultrasonic vibration device 101 according to the first embodiment and the ultrasonic vibration device disclosed in Patent Document 1. FIG. 4(B) is a diagram illustrating reverberation times of the ultrasonic vibration device 101 according to the first embodiment and the ultrasonic vibration device disclosed in Patent Document 1. In both diagrams, a sample number n is three.

While the ultrasonic vibration device having a related art structure disclosed in Patent Document 1 has a sensitivity of approximately 4.9 Vpp, the ultrasonic vibration device 101 according to the first embodiment has a high sensitivity of approximately 6.4 Vpp. Further, while the ultrasonic vibration device having a related art structure disclosed in Patent Document 1 has a reverberation time of approximately 900 μs, the ultrasonic vibration device 101 according to the first embodiment has a short reverberation time of approximately 720 μs. Herein, the reverberation time corresponds to the time from the start of the transmission to the time point at which a signal envelope crosses 1 V0p (absolute value voltage 1V).

As described above, the sensitivity and the reverberation characteristic having the trade-off relationship are both improved at the same time.

According to the first embodiment, the following effects are provided.

The vibration suppression areas SVA in the bottom surface of the case 31 and the reinforcing member 41 reinforcing these are formed on the inner bottom surface of the case 31. Thereby, the rigidity of the vibration suppression areas SVA is increased, and it is possible to more suppress the propagation of the vibration of the bottom surface of the case 41 to the side portion of the case 41, and to form a vibration surface which transmits and receives necessary acoustic waves. Further, the side portion of the case 31 is reduced in thickness over the entire circumference to reduce the rigidity thereof, and the area of direct contact between the filling member 35 and the case 31 is increased. It is thereby possible to enhance the damping effect due to the filling member 35. As a result, a low reverberation characteristic is obtained without degradation in sensitivity.

Further, in the present invention, the reinforcing member 41 enhancing the effect of the vibration suppression areas SVA has a simple shape, and thus is processable by an inexpensive press or the like. Accordingly, an overall reduction in cost is attained.

The reinforcing member 41 is disposed on the vibration suppression areas SVA of the case 31, and is sealed by filling with the filling member 35. Even if the case 31 and the reinforcing member 41 are made of different metals distant from each other in ionization tendency, therefore, the outer circumferences of bonding surfaces between the vibration suppression areas SVA of the case 31 and the reinforcing member 41 are sealed by the filling agent 35. Thus, there is no possibility of corrosion in the bonding surfaces between the case 31 and the reinforcing member 41.

Further, it is possible to design the side portion of the case 31 to be thin. Therefore, the opening portion of the case 31 is increased, and it is possible to mount inside the case 31 a preamplifier substrate for signal processing, for example.

Subsequently, description will be made of relationships between the dimensions of the respective portions illustrated in FIGS. 2(A) to 2(C) and characteristics of an ultrasonic sensor.

Figure 5A:
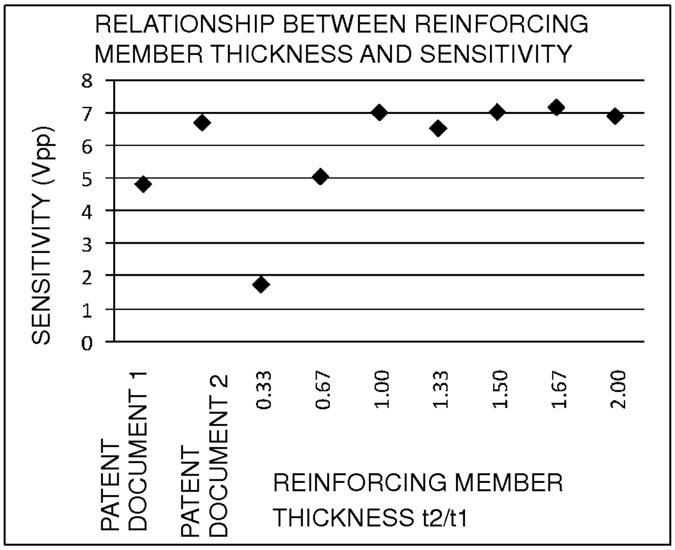
FIG. 5(A) is a diagram illustrating changes in sensitivity according to changes in dimensional ratio t2/t1, wherein t2 and t1 represent the thickness dimension of a reinforcing member 41 and the thickness of vibration suppression areas, respectively.
Figure 5B:
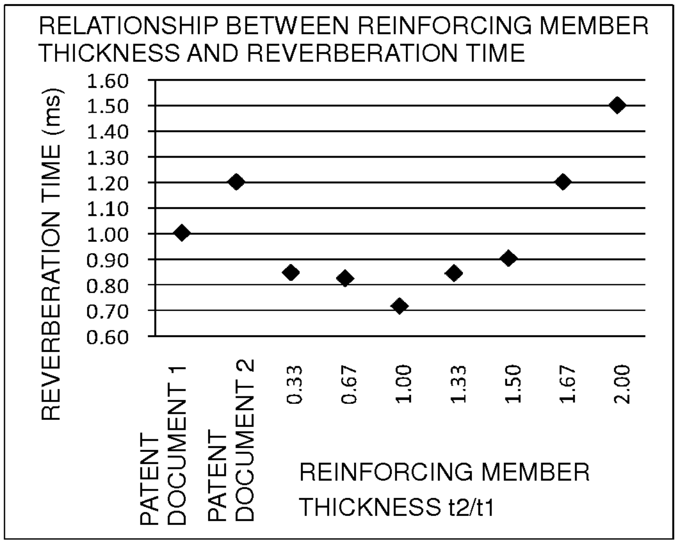
FIG. 5(B) is a diagram illustrating changes in reverberation time according to the changes in the dimensional ratio t2/t1.

FIG. 5(A) illustrates the results of changes in sensitivity according to changes in dimensional ratio t2/t1, wherein t2 and t1 represent the thickness dimension of the reinforcing member 41 and the thickness of the vibration suppression areas SVA, respectively. Further, FIG. 5(B) illustrates the results of changes in reverberation time according to the changes in the dimensional ratio t2/t1. Both diagrams illustrate the results of a case where t1/t0 is 0.17 when t0 represents the height dimension of the case 31.

As is obvious from FIG. 5(A) and FIG. 5(B), when t2/t1 is 0.67 or more, the sensitivity and the reverberation are both improved as compared with those of Patent Document 1. When t2/t1 is close to 0.67, the sensitivity is slightly lower than that of Patent Document 2, but a reverberation characteristic sufficient for practical use is obtained. In view of these, to obtain an effect of improving the reverberation over the related art, it is effective to design the configuration such that t2/t1 falls within a range from 0.67 to 1.50 (both inclusive).

The rigidity of the vibration suppression areas SVA of the case is increased in accordance with the increase of the thickness t2 of the reinforcing member 41. If t2/t1 exceeds 1.50, however, the reverberation suppression effect on the side surface of the case 31 due to the filling member (elastic resin) 35 is reduced, and the reverberation time is increased.

If t2/t1 is less than 0.67, the reverberation suppression effect due to the filling member (elastic resin) 35 is increased.

However, the case vibration suppression effect is reduced, and the vibration leaks to the side surface of the case 31. Thereby, the sensitivity is degraded.

Figure 6A:
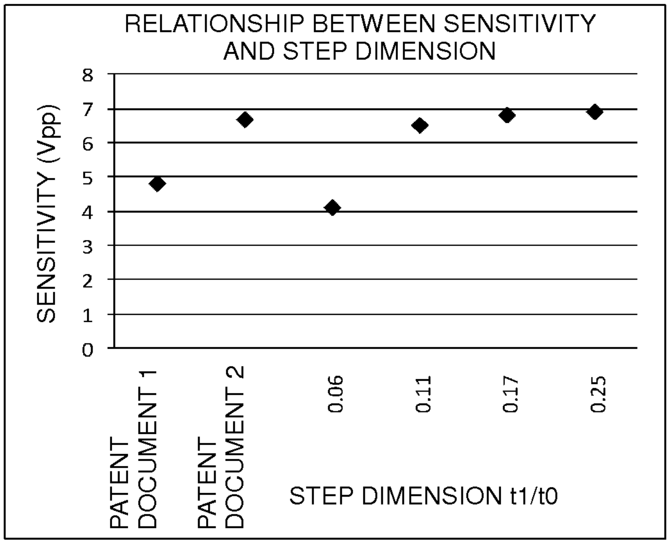
FIG. 6(A) is a diagram illustrating changes in sensitivity according to changes in dimensional ratio t1/t0 of the thickness t1 of the vibration suppression areas to a height dimension t0 of the case 31.

FIG. 6(A) illustrates the results of changes in sensitivity according to changes in dimensional ratio $t1/t0$ of the thickness $t1$ of the vibration suppression areas to the height dimension $t0$ of the case 31. Further, FIG. 6(B) illustrates the results of changes in reverberation time according to the changes in the dimensional ratio $t1/t0$.

Both diagrams illustrate the results of a case where $t2/t1$ is 1.0.

Figure 6B:
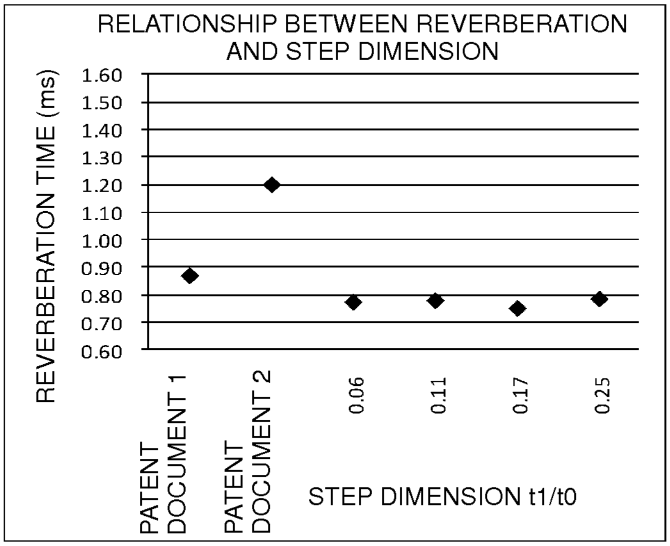
FIG. 6(B) is a diagram illustrating changes in reverberation time according to the changes in the dimensional ratio t1/t0.

As is obvious from FIG. 6(A) and FIG. 6(B), it is understood that, if $t1/t0$ is in a range from 0.11 to 0.25 (both inclusive), the sensitivity and the reverberation are both superior to those of Patent Document 1 and Patent Document 2.

To obtain a favorable reverberation characteristic, it suffices if $t1/t0$ is 0.6 or more. To obtain a sensitivity higher than that of the structure of Patent Document 1, however, $t1/t0$ needs to be 0.11 or more.

This is because, if $t1/t0$ is less than 0.11, the case vibration suppression effect is low and the vibration leaks to the side surface of the case 31, and thereby the reverberation is suppressed by the filling member (elastic resin) 35 but the sensitivity is degraded at the same time.

Meanwhile, if $t1/t0$ is more than 0.25, the amount of the filling material is small, and the reinforcing of the wiring members may be insufficient. In view of these, it is effective to design the configuration such that $t1/t0$ falls within a range from 0.11 to 0.25 (both inclusive).

If a condition of $t1+t2<t0$ is satisfied, the area of direct contact of the filling member 35 with the side portion of the case 31 is secured, and it is possible to damp the vibration of the side portion of the case.

Second Embodiment

Figure 7A:
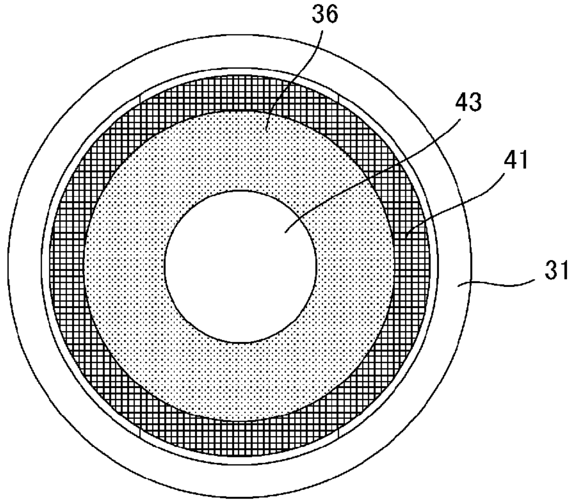
FIG. 7(A) is a plan view of an ultrasonic vibration device 102 according to a second embodiment before being filled with a filling member 35, as viewed from the side of an opening surface of a case 31.
Figure 7B:
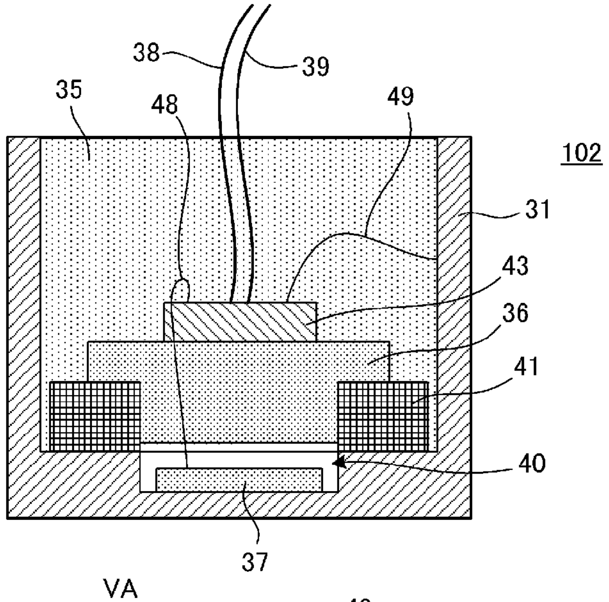
FIG. 7(B) is a cross-sectional view of the ultrasonic vibration device 102.
Figure 7C:
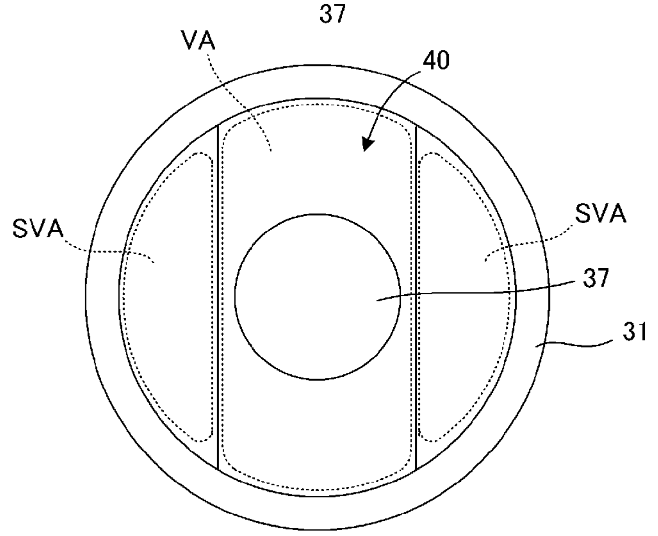
FIG. 7(C) is a plan view of the case 31 as viewed from the side of the opening surface thereof.

FIG. 7(A) is a plan view of an ultrasonic vibration device 102 according to a second embodiment before being filled with a filling member 35, as viewed from the side of an opening surface of a case 31. FIG. 7(B) is a cross-sectional view of the ultrasonic vibration device 102, and FIG. 7(C) is a plan view of the case 31 as viewed from the opening surface thereof.

The structure of the case 31 is the same as the one illustrated in FIGS. 2(A) to 2(C) in the first embodiment. As illustrated in FIG. 7(C), an inner bottom surface of the case 31 is formed with a substantially oblong recess 40 having a long axis and a short axis. A piezoelectric element 37 is bonded to the center of this recess 40. The substantially oblong recess 40 in the inner bottom surface of the case 31 mainly forms a vibration area VA. Further, vibration suppression areas SVA thicker than the vibration area are disposed on the opposite sides of the vibration area VA in the inner bottom surface of the case 31. A side portion of the case 31 is thin, and the thickness thereof is uniform or substantially uniform.

As illustrated in FIG. 7(B), a ring-shaped reinforcing member 41 is bonded to upper portions of the vibration suppression areas SVA. These reinforcing members 41 are also the same as the one illustrated in FIGS. 2(A) to 2(C) in the first embodiment.

As illustrated in FIG. 7(B), a sound-absorbing member 36 made of sponge, felt, elastic foam, or the like is disposed at a position facing the vibration area VA, with a certain gap formed between the sound-absorbing member 36 and the piezoelectric element 37. A relay substrate 43 is placed on the upper surface of this sound-absorbing member 36. The relay substrate 43 electrically connects internal wiring members 48 and 49 and wiring members 38 and 39. The wiring members 38 and 39 may be formed by lead wires or pin terminals.

An electrode formed on one surface of the piezoelectric element 37 is in electrical continuity with the inner bottom surface of the case 31. An electrode formed on the other surface of the piezoelectric surface 37 and an electrode on the relay substrate are connected by the internal wiring member 48. Further, the case 31 and an electrode on the relay substrate are connected by the internal wiring member 49.

The interior of the case 31 is filled with the filling member 35. The reinforcing member 41 is not bonded to the inner side surface of the case 31, and there is a gap therebetween. Thus, the gap is also filled with the filling member 35.

The vibration suppression areas SVA and the reinforcing member 41 reinforcing these are thus formed on the inner bottom surface of the case 31. Thereby, the vibration suppression areas SVA have high rigidity, and it is possible to more suppress the propagation of the vibration of the bottom surface of the case 31 to the side portion of the case 31, and to form a vibration surface which transmits and receives necessary ultrasonic waves. Further, the side portion of the case 31 is reduced in thickness over the entire circumference to reduce the rigidity thereof, and the area of direct contact between the filling member 35 and the case 31 is increased. Thereby, a high damping effect due to the filling member 35 is obtained.

Third Embodiment

Figure 8A:
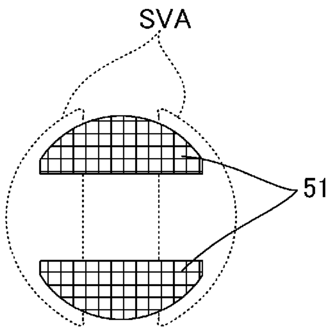
FIG. 8(A), FIG. 8(B), and FIG. 8(C) are plan views of three types of reinforcing members used in an ultrasonic vibration device according to a third embodiment.
Figure 8B:
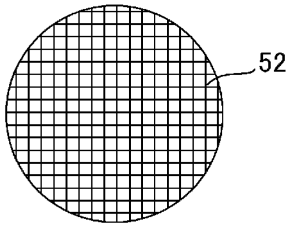
Figure 8C:
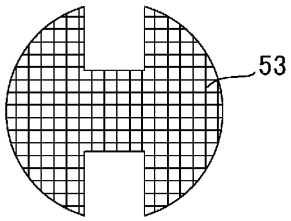

FIG. 8(A), FIG. 8(B), and FIG. 8(C) are plan views of three types of reinforcing members used in an ultrasonic vibration device according to a third embodiment.

Although the ring-shaped reinforcing member 41 is provided in the first and second embodiments, it suffices if the reinforcing member has a structure reinforcing the two vibration suppression areas SVA. For example, the reinforcing member may be divided into two parts, as in reinforcing members 51 and 52 illustrated in FIG. 8(A). In this case, the reinforcing member serving as a weight on the vibration suppression areas SVA extends across the two vibration suppression areas SVA. Thereby, the reinforcing member is not displaced together with the vibration suppression areas SVA, and it is possible to enhance the effect of the reinforcing member. Further, the reinforcing member may be integrated into a disc shape, as in a reinforcing member 52 illustrated in FIG. 8(B). Further, the reinforcing member may have a shape partially connecting two portions which reinforce the vibration suppression areas SVA, as in a reinforcing member 53 illustrated in FIG. 8(C).

If the reinforcing member is thus formed to extend across the respective vibration suppression areas SVA, it is possible to suppress the vibration of the vibration suppression areas SVA. It is therefore possible to form a vibration surface which transmits and receives more necessary acoustic waves.

Further, each of the opposite sides of the vibration area is provided with single step vibration suppression area SVA in the first and second embodiments, but may be provided with multiple steps vibration suppression areas.

If the reinforcing member 51 has a ring shape having an opening portion, as in the reinforcing member 51 illustrated in FIG. 2(A) and FIG. 7(A), it is possible to use the opening portion to hold the sound-absorbing member 36 and as a path for the wiring members. Similarly, if the reinforcing member has a shape including cut-off portions, as in the reinforcing member 53 illustrated in FIG. 8(C), it is possible to use the cut-off portions to hold the sound-absorbing member 36 and as a path for the wiring members.

Other Embodiments

In the first and second embodiments, the reinforcing member 41 higher in rigidity than the inner bottom portion of the case 31 is disposed on the vibration suppression areas SVA.

However, the inner bottom portion of the case 31 may be further provided with step portions having different thicknesses, and thick areas thereof may be used as the vibration suppression areas.

Further, in the first and second embodiments of the present invention, description has been made of the shape of the vibration area VA with reference to the substantially oblong shape having a long axis and a short axis in the inner bottom surface. However, the vibration area VA is not limited to the substantially oblong shape, and may have a shape having a long axis and a short axis, such as a substantially elliptical shape and a substantially rectangular shape, and a substantially circular shape.

REFERENCE SIGNS LIST

SVA vibration suppression area
VA vibration area
31 case
35 filling member
36 sound-absorbing member
37 piezoelectric element
38, 39 wiring member
40 recess
41 reinforcing member
43 relay substrate
48, 49 internal wiring members
51, 52, 53 reinforcing member
101, 102 ultrasonic vibration device

The invention claimed is:

1. An ultrasonic vibration device comprising:
- a case having a side portion and a bottom, the side portion and the bottom defining an interior area and an inner bottom portion, the inner bottom portion of the case defining a vibration area and a vibration suppression area, a thickness of the vibration suppression area being greater than that of the vibration area;
- a piezoelectric element adjacent the vibration area of the case;
- a reinforcing member having a greater rigidity than that of the vibration suppression area and disposed adjacent the vibration suppression area; and
- an elastic resin filling the interior area of the case.

2. The ultrasonic vibration device described in claim 1, wherein the case is cylindrical.

3. The ultrasonic vibration device described in claim 1, wherein the side portion of the case has a uniform thickness.

4. The ultrasonic vibration device described in claim 1, wherein the elastic resin fills a peripheral portion of the inner bottom portion of the case.

5. The ultrasonic vibration device described in claim 4, wherein the elastic resin fills a gap between the side portion of the case and the reinforcing member.

6. The ultrasonic vibration device described in claim 1, wherein the vibration suppression area is divided by the vibration area, and the reinforcing member extends across the divided vibration suppression area.

7. The ultrasonic vibration device described in claim 1, wherein, when a height of the case, the thickness of the vibration suppression area, and a thickness of the reinforcing member are represented by t0, t1, and t2, respectively, the case, the vibration suppression area, and the reinforcing member are configured to establish a relationship $0.67 \leq t2/t1 \leq 1.5$, $0.11 \leq t1/t0 \leq 0.25$, and $t1+t2<t0$.

8. The ultrasonic vibration device described in claim 1, further comprising a sound-absorbing member disposed so as to face the vibration area.

9. The ultrasonic vibration device described in claim 8, wherein the sound-absorbing member is disposed so as to face the vibration area such that there is a gap between the sound-absorbing member and the piezoelectric element.

10. The ultrasonic vibration device described in claim 8, further comprising a relay structure disposed adjacent the sound-absorbing member, the relay structure electrically connecting wiring members for the ultrasonic vibration device.

11. The ultrasonic vibration device described in claim 1, wherein, when the thickness of the vibration suppression area and a thickness of the reinforcing member are represented by t1 and t2, respectively, the vibration suppression area and the reinforcing member are configured to establish a relationship $0.67 \leq t2/t1 \leq 1.5$.

12. The ultrasonic vibration device described in claim 1, wherein, when a height of the case and the thickness of the vibration suppression area are represented by t0 and t1, respectively, the case and the vibration suppression area are configured to establish a relationship $0.11 \leq t1/t0 \leq 0.25$.

13. The ultrasonic vibration device described in claim 1, wherein, when a height of the case, the thickness of the vibration suppression area, and a thickness of the reinforcing member are represented by t0, t1, and t2, respectively, the case, the vibration suppression area, and the reinforcing member are configured to establish a relationship $t1+t2<t0$.

14. The ultrasonic vibration device described in claim 1, further comprising a relay structure that electrically connects wiring members for the ultrasonic vibration device.

15. The ultrasonic vibration device described in claim 1, wherein the reinforcing member has two separate parts.

16. The ultrasonic vibration device described in claim 1, wherein the reinforcing member has a disc shape.

17. The ultrasonic vibration device described in claim 1, wherein the reinforcing member is shaped so as to extend over the vibration area.

* * * * *